(12) United States Patent
Mizumura (10) Patent No.: US 12,370,623 B2
(45) Date of Patent: Jul. 29, 2025

(54) LASER REPAIR METHOD AND LASER REPAIR DEVICE

(71) Applicant: V TECHNOLOGY CO., LTD., Kanagawa (JP)

(72) Inventor: Michinobu Mizumura, Kanagawa (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 886 days.

(21) Appl. No.: 17/438,228

(22) PCT Filed: Feb. 7, 2020

(86) PCT No.: PCT/JP2020/004877
§ 371 (c)(1),
(2) Date: Sep. 10, 2021

(87) PCT Pub. No.: WO2020/184024
PCT Pub. Date: Sep. 17, 2020

(65) Prior Publication Data
US 2022/0184729 A1  Jun. 16, 2022

(30) Foreign Application Priority Data
Mar. 11, 2019  (JP) ................. 2019-043524

(51) Int. Cl.
*B23K 26/03* (2006.01)
*B23K 26/351* (2014.01)
*B23K 26/70* (2014.01)

(52) U.S. Cl.
CPC .......... *B23K 26/032* (2013.01); *B23K 26/351* (2015.10); *B23K 26/702* (2015.10)

(58) Field of Classification Search
CPC ... B23K 26/032; B23K 26/351; B23K 26/702
See application file for complete search history.

(56) References Cited

U.S. PATENT DOCUMENTS

| 5,837,962 A * | 11/1998 | Overbeck .......... B23K 26/0665 219/121.75 |
| 2006/0065645 A1* | 3/2006 | Nakasu .................. B23K 26/34 219/121.68 |

(Continued)

FOREIGN PATENT DOCUMENTS

| CN | 101673666 A | 3/2010 |
| CN | 102412114 A | 4/2012 |

(Continued)

OTHER PUBLICATIONS

JP2008180907A—Translate (Year: 2024).*

(Continued)

*Primary Examiner* — Elizabeth M Kerr
*Assistant Examiner* — Keith Brian Assante
(74) *Attorney, Agent, or Firm* — Osha Bergman Watanabe & Burton LLP (57) ABSTRACT

The present invention enables a layer to be worked to be properly subjected to a correcting process without being affected by the variations in the material of the underlayer or in the film thickness of the layer. A laser repair method for irradiating a defect portion of a multilayer film structure formed on a substrate, and performing a correcting process is provided. The method includes: acquiring an image of a region including the defect portion; and setting a scan range of the laser beam on the image so as to include the defect portion. At the time of scan of the inside of the scan range with the laser beam, at a scanning position at which color information of the image is recognized as that of the defect portion, an output of the laser beam is controlled to be ON or High.

9 Claims, 5 Drawing Sheets

(56) References Cited

U.S. PATENT DOCUMENTS

| | | | | |
|---|---|---|---|---|
| 2008/0124816 A1* | 5/2008 | Bruland | ............... | B23K 26/082 |
| | | | | 257/E23.15 |
| 2008/0129950 A1* | 6/2008 | Abe | ...................... | G02F 1/1309 |
| | | | | 349/192 |
| 2009/0242531 A1* | 10/2009 | Baird | ................. | B23K 26/0622 |
| | | | | 219/121.81 |
| 2010/0183040 A1* | 7/2010 | Ishizu | ................. | B23K 26/0622 |
| | | | | 372/25 |
| 2012/0071056 A1* | 3/2012 | Oka | ..................... | B23K 26/361 |
| | | | | 445/2 |
| 2012/0302122 A1* | 11/2012 | Sbar | ................... | B23K 26/0622 |
| | | | | 445/2 |
| 2014/0138359 A1* | 5/2014 | Carr | .................... | C03C 23/0025 |
| | | | | 219/121.8 |
| 2016/0342054 A1* | 11/2016 | Wei | ........................ | H05K 3/225 |
| 2017/0209961 A1* | 7/2017 | Cavanaugh | ......... | B23K 26/0823 |
| 2018/0141170 A1* | 5/2018 | Chojnacki | ............ | B23K 26/703 |

FOREIGN PATENT DOCUMENTS

| | | | |
|---|---|---|---|
| CN | 203265909 U | | 11/2013 |
| CN | 203409425 U | | 1/2014 |
| CN | 203918234 U | | 11/2014 |
| JP | 2001-298085 A | | 10/2001 |
| JP | 2006119575 A | | 5/2006 |
| JP | 2008-188638 A | | 8/2008 |
| JP | 2008180907 A | * | 8/2008 |
| JP | 2009-163056 A | | 7/2009 |
| JP | 2009-271274 A | | 11/2009 |
| JP | 2009262161 A | | 11/2009 |
| JP | 2010064120 A | | 3/2010 |
| JP | 2010097433 A | | 4/2010 |
| JP | 2011-099875 A | | 5/2011 |
| JP | 2011101903 A | | 5/2011 |
| JP | 2013146760 A | | 8/2013 |

OTHER PUBLICATIONS

English Translation of Written Opinion issued in corresponding International Patent Application No. PCT/JP2020/004877 dated Apr. 14, 2020 (5 pages).

Office Action issued in counterpart Japanese Application No. 2019-043524; Dated Apr. 4, 2023. (7 pages).

Office Action issued in counterpart Chinese Application No. 202080017234.0, dated Aug. 19, 2023, with English translation (13 pages).

Office Action issued in corresponding Japanese Patent Application No. 2019043524, dated Dec. 6, 2022, with translation (9 pages).

Office Action issued in corresponding Chinese Patent Application No. 202080017234.0, dated Feb. 14, 2023, with translation (14 pages).

Office Action issued in corresponding Japanese Patent Application No. 2019-043524, dated Mar. 5, 2024, with translation (9 pages).

Office Action issued in corresponding Korean Patent Application No. 10-2021-7027234, dated Mar. 4, 2024, with translation (8 pages).

International Search Report issued in corresponding International Patent Application No. PCT/JP2020/004877 dated Apr. 14, 2020 (5 pages).

Written Opinion issued in corresponding International Patent Application No. PCT/JP2020/004877 dated Apr. 14, 2020 (3 pages).

Office Action issued in corresponding Japanese Patent Application No. 2019-043524 dated Aug. 30, 2022 (6 pages).

* cited by examiner

LASER REPAIR METHOD AND LASER REPAIR DEVICE

TECHNICAL FIELD

The present invention relates to a laser repair method and a laser repair device.

BACKGROUND ART

Conventionally, with respect to a multilayer structured wiring pattern formed on a substrate, a laser repair device checks the defect image obtained by shooting the to-be-inspected part and the defect-free reference image, thereby detecting a defect, designates the work position and the work range to be irradiated with a laser beam for the detected defect, and irradiates the designated work position and work range with a laser beam (see the following PTL 1).

CITATION LIST

Patent Literature

[PTL 1] Japanese Patent Application Publication No. 2008-188638

SUMMARY OF INVENTION

Technical Problem

With respect to an image of a wiring pattern indicating the detected defect, a conventional laser repair device designates a rectangular work range including a defect portion on the image by a graphic user interface, and performs a correcting process on the entire work range region with given repair recipes (work parameters such as the laser energy, the laser frequency, and the number of laser shots).

Such a conventional laser repair device performs work on the inside of the work range with a given repair recipe even when the materials of the underlayer in the defect portion to be worked partially vary. Accordingly, unevenness is caused between the portion to be removed and the portion not to be removed due to the difference in material of the underlayer. As a result, proper correction may not be able to be performed on the defect portion. In contrast, when all the defect portions are tried to be removed with work under excessive conditions, the underlayer of the defect portion is excessively removed. As a result, undesirably, the proper layer structure cannot be maintained.

Further, when a variation is present in the film thickness of the layer in the manufacturing process of a large size substrate, or the like in a multilayer structured work object, with the conventional laser repair device, work of the defect portion is performed with a given determined repair recipe despite the fact that the film thickness varies according to the place to be corrected. For this reason, also in this case, the defect portion to be removed with the work remains, or the underlayer is removed by excessive work. As a result, undesirably, proper correction cannot be performed.

Further, with a conventional laser repair device, the layer except for the defect portion to be worked is exposed in a rectangular work range. For this reason, when the entire work range region is worked with a given repair recipe, undesirably, not only the layer of the defect portion but also the layer exposed therearound are worked.

The present invention has been proposed in order to cope with such a problem. Namely, the objects of the present invention are to enable the correcting process to be properly performed on the defect portion to be worked without being affected by the variations in the material of the underlayer and the film thickness of the layer; to suppress the exposed layer around the defect portion to be worked from being worked, thereby enabling the correction of the defect portion to be worked with reliability; and to enable automatic execution of the proper correcting process by which remaining of the defect portion to be worked and excessive work of the underlayer of the defect portion to be worked are suppressed.

Solution to Problem

In order to solve such problems, the present invention includes the following configurations.

A laser repair device for irradiating a defect portion of a multilayer film structure formed on a substrate with a laser beam, and performing a correcting process is provided. The device includes: a scanning part for scanning a scan range including the defect portion with a laser beam; a camera part for acquiring an image of a region including the defect portion; and a control part for controlling the scanning part and an output of the laser beam based on the image acquired by the camera part. The control part controls the output of the laser beam to be ON or High at a scanning position at which color information of the image is recognized as that of the defect portion at the time of scan with the laser beam.

A laser repair device for irradiating a defect portion of a multilayer film structure formed on a substrate with a laser beam, and performing a correcting process is provided. The device includes: a scanning part for scanning a scan rage including the defect portion with a laser beam; a camera part for acquiring an image of a region including the defect portion; and a control part for controlling the scanning part and an output of the laser beam based on the image acquired by the camera part. The control part controls the output of the laser beam to be ON or High at a scanning position at which color information of the image is recognized as that of the defect portion at the time of scan with the laser beam.

BRIEF DESCRIPTION OF DRAWINGS

FIG. 3($a$) is an explanatory view showing a spectral image acquiring process and a color image recognize process and is an entire-wavelength image of a region including a defect portion.

FIG. 3($b$) is an explanatory view showing a spectral image acquiring process and a color image recognize process and is a judged two-layer color image.

FIG. 3($c$) is an explanatory view showing a spectral image acquiring process and a color image recognize process and is a first-layer color image serving as an underlayer of the defect portion.

FIG. 4($a$) is an explanatory view showing a defect portion image extraction process and a scan range setting process and is a second-layer color image judged from a spectral image acquired by a spectral image acquiring part.

FIG. 4($b$) is an explanatory view showing a defect portion image extraction process and a scan range setting process and is a second-layer reference image.

FIG. 4(c) is an explanatory view showing a defect portion image extraction process and a scan range setting process and is an image of only the extracted defect portion).

DESCRIPTION OF EMBODIMENTS

Below, embodiments of the present invention will be described by reference to the accompanying drawings. In the following description, the same reference numbers and signs in different drawings denote the portions having the same function, and overlapping description in each drawing will be appropriately omitted.

Figure 1:
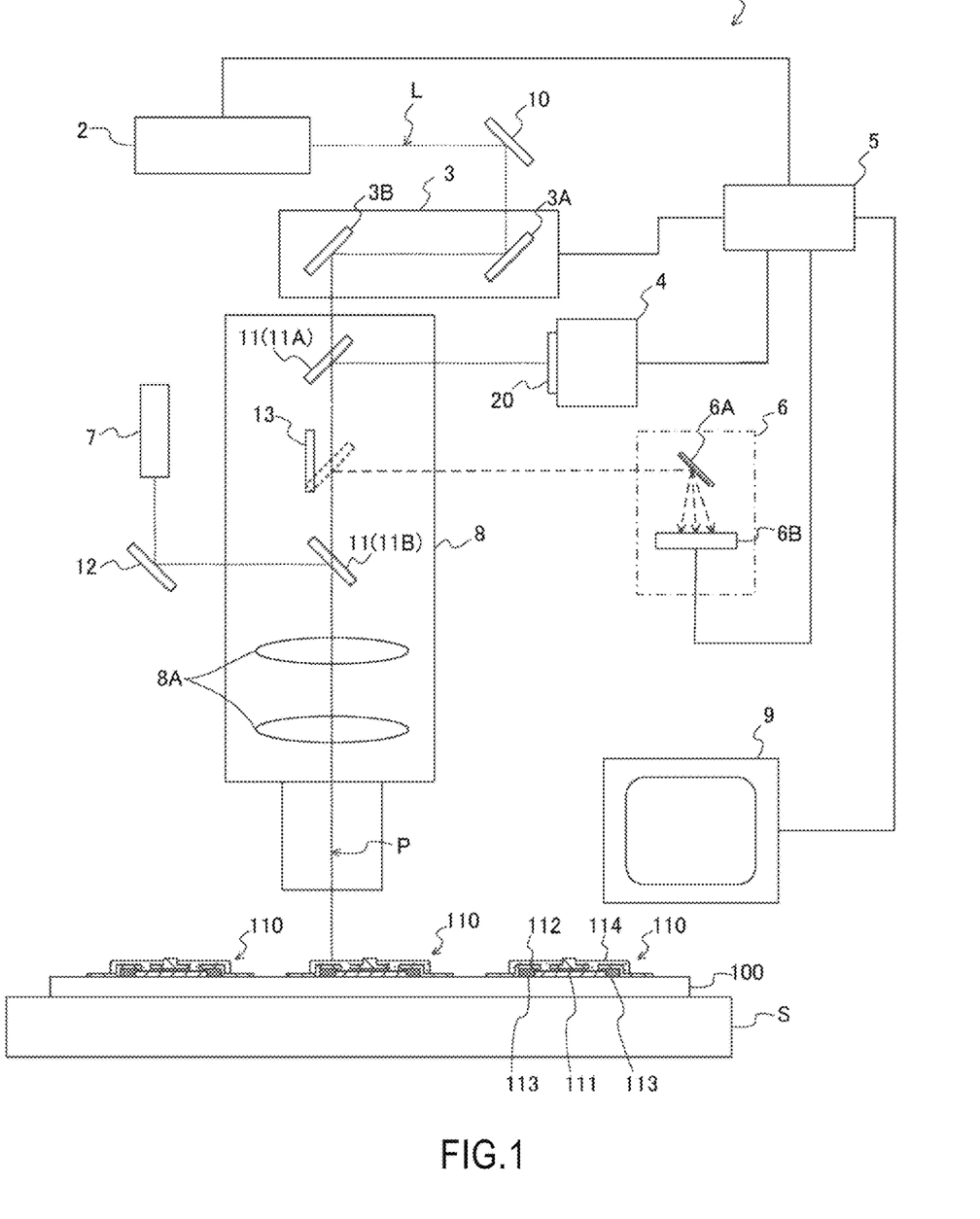
FIG. 1 is an explanatory view showing the overall configuration of a laser repair device in accordance with an embodiment of the present invention.

FIG. 1 shows one example of the overall configuration of a laser repair device in accordance with an embodiment of the present invention. A laser repair device 1 is a device for irradiating the defect portion of a multilayer film structure 110 formed on a substrate 100 with a laser beam, and performing a correcting process. The substrate 100 is supported on a stage S capable of moving two dimensionally, and an optical axis P of the laser repair device 1 can be matched with a given position on the substrate.

The object to be worked is, for example, a TFT substrate. The TFT substrate is configured such that a multilayer film structure 110 of a TFT (Thin-Film-Transistor) is formed on the substrate 100 of glass or the like. The multilayer film structure 110 includes a first layer (e.g., a polysilicon layer (p-Si; polysilicon)) 111, a second layer (e.g., a metal electrode) 112, a third layer (e.g., an insulation layer) 113, a fourth layer (e.g., a protection layer) 114, and the like as one example.

In FIG. 1, the laser repair device 1 includes a laser oscillator 2 for emitting a laser beam L, a scanning part 3 for scanning the set scan range with the laser beam L, a camera part 4 for acquiring an image of the region including a defect portion, a control part 5 for controlling the scanning part 3 and an output of the laser beam, a spectral image acquiring part 6 for acquiring the spectral image of the region including a defect portion, a white light source 7 for irradiating the region including a defect portion with a white light, and a microscope 8 having an optical system 8A coaxial with the camera part 4 and the spectral image acquiring part 6.

The control part 5 controls the scanning part 3 and the output of a laser beam based on the images acquired by the camera part 4 and the spectral image acquiring part 6. The data of the image acquired by the camera part 4 or the spectral image acquired by the spectral image acquiring part 6 is transmitted to the control part 5. The control part 5 is connected with a monitor device 9 capable of monitoring the image or the spectral image.

The laser beam L emitted from the laser oscillator 2 is reflected by, for example, a mirror 10, is reflected by two galvanometer mirrors 3A and 3B forming the scanning part 3, is transmitted through a half mirror 11 (11A), transmitted through the optical system 8A of the microscope 8, and is applied to the defect portion to be subjected to a correcting process.

With the scanning part 3, the scan range (work range) of the laser beam L is set by the driving range of the galvanometer mirrors 3A and 3B, so that the irradiation point of the laser beam is moved within the scan range. The form of scan has no particular restriction. However, as shown, in the example using the two galvanometer mirrors 3A and 3B, by driving of one galvanometer mirror 3A, one dimensional linear scan can be performed, and by driving of the other galvanometer mirror 3B, raster scan of performing scan in the direction crossing with the linear scan can be performed.

The camera part 4 acquires the image of the region including the defect portion to be subjected to a correcting process. The white light emitted from the white light source 7 goes by way of the mirror 12, the half mirror 11 (11B), and the optical system 8A, and is applied to the region whose image is acquired by the camera part 4. The light reflected therefrom goes by way of the optical system 8A and the half mirrors 11 (11A and 11B), and is formed into an image on the imaging surface of the camera part 4. A color image of the region including the defect portion to be subjected to a correcting process is outputted from the camera part 4. The image data is transmitted to the control part 5. In the example shown, a filter 20 for cutting the laser beam reflected in the to-be-irradiated region is disposed at the previous stage of the camera part 4. As a result of this, it is possible to cut the reflected laser beam and to acquire an image of the defect portion while irradiating the defect portion with a laser beam.

The spectral image acquiring part 6 irradiates the region including the defect portion with a white light by inserting a switch mirror 13 onto the optical axis of the microscope 8, and spectrally disperses the reflected light from the region irradiated with the white light, thereby acquiring a spectral image. The spectral image acquiring part 6 includes a spectroscope 6A and a 2D camera 6B. In the example shown, although switching of the optical system is performed using the switch mirror 13, the spectral image acquiring part 6 may be unitized, and inserted into the subsequent stage of the optical system 8A of the microscope 8.

The white light emitted from the white light source 7 goes by way of the mirror 12, the half mirror 11 (11B), and the optical system 8A, and is applied to the region including the defect portion. The reflected light therefrom goes by way of the optical system 8A, is reflected by the switch mirror 13, is spectrally dispersed by the spectroscope 6A and is formed into an image on the imaging surface of the 2D camera 6B. The 2D camera 6B forms the lights spectrally dispersed at the spectroscope 6A into images with lines with respective wavelengths. While scanning the region to be irradiated with the white light in one direction, the images line-imaged for respective wavelengths are acquired on the imaging surface of the 2D camera 6B, and the images with the same wavelength and at different timings are connected. By performing this processing, a two-dimensional image (spectral image) for every wavelength is acquired.

The switch mirror 13 is disposed so as to be inserted/retreated into/from the optical axis of the microscope 8. With the switch mirror 13 coming out of the optical axis of the microscope 8, the camera part 4 acquires an image. Further, in this state, the defect portion is irradiated with the laser beam L. With the switch mirror 13 inserted into the optical axis of the microscope 8, as described previously, the spectral image acquiring part 6 acquires the spectral image of the region including the defect portion.

The process of the laser repair method using such a laser repair device 1 is performed after identifying the defect portion based on the inspection results by a defect inspection device. In the inspection process by the defect inspection device, for example, data such as process information on which process has caused the defect in addition to the position coordinates, the shape, the size, and the color of the defect portion, and the like are acquired as the inspection results with respect to the identified defect portion.

Figure 2:
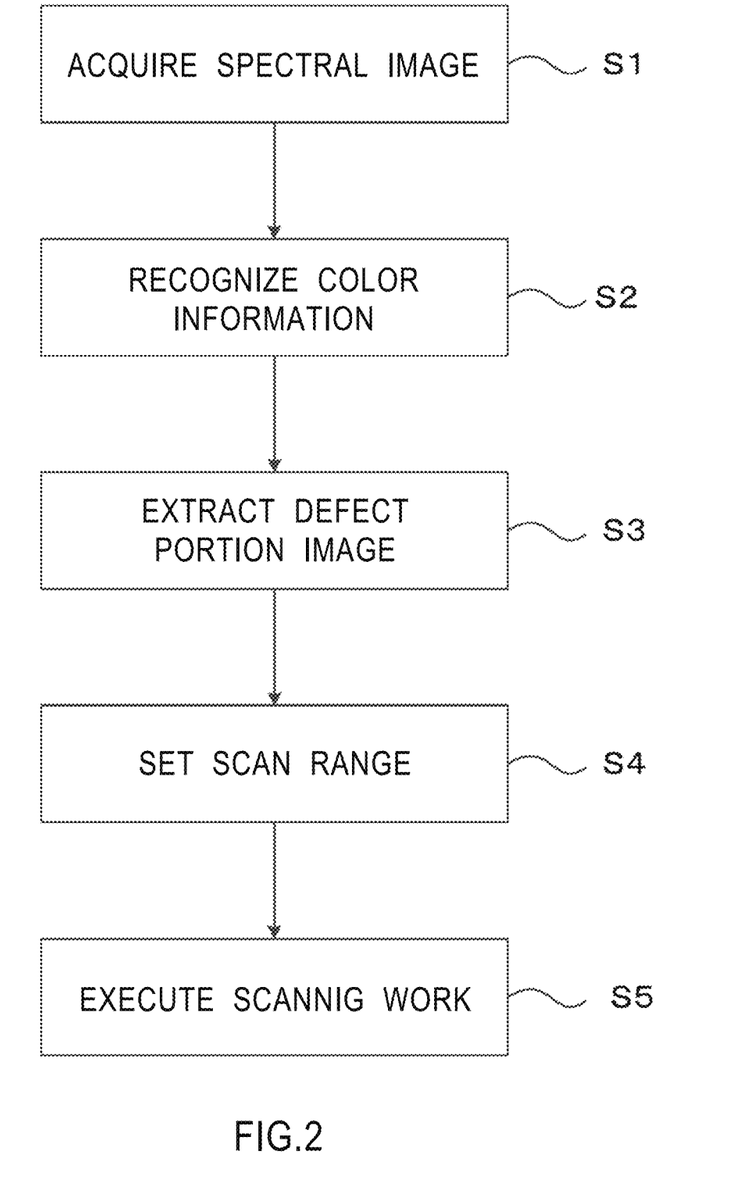
FIG. 2 is an explanatory view showing the process of a laser repair method in accordance with an embodiment of the present invention.

With the process of the laser repair method using the laser repair device 1, after the inspection process, as the preparatory process, the laser repair device 1 or the stage S supporting the substrate 100 is moved so as to match the optical axis P (the optical axis of the microscope 8) of the laser repair device 1 with the position of the defect portion identified to be subjected to performing the correcting process. Then, the camera part 4 is allowed to acquire the image including the defect portion to be subjected to the correcting process. Subsequently, as shown in FIG. 2, respective processes of spectral image acquisition (S1), color information recognition (S2), defect portion image extraction (S3), scan range setting (S4), and scanning work execution (S5) are performed.

In the spectral image acquiring process (S1), the region including the defect portion is irradiated with the white light emitted from the white light source 7. While scanning the region in one direction, the reflected light from the region is made incident upon the spectral image acquiring part 6, thereby acquiring a spectral image. The image data is transmitted to the control part 5. At this step, while scanning the region to be irradiated with the white light in one direction, the images line-imaged for respective wavelength are acquired on the imaging surface of the 2D camera 6B. The images with the same wavelength and at different timings are connected. By performing this processing, the spectral image is acquired.

Figure 3A:
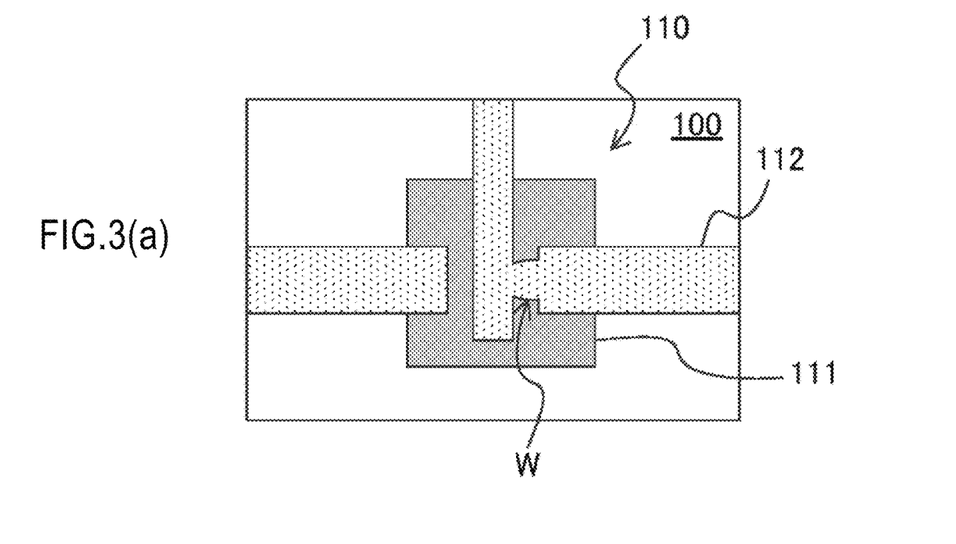

Then, by superimposing the spectral images for respective wavelengths, the all-wavelength image of the region including a defect portion W is acquired as shown in FIG. 3(a). In the example shown, there is acquired an all-wavelength image with a first layer 111 of a polysilicon layer formed on the substrate 100 of glass, and a second layer 112 of a metal electrode formed so as to partially overlap the first layer 111. The pattern shapes of the layer having the defect portion W (the second layer 112) and its underlayer (the first layer 111), and the like can be confirmed by the all-wavelength image. Then, a spectral image for each wavelength is acquired by the spectral image acquiring part 6.

Figure 3B:
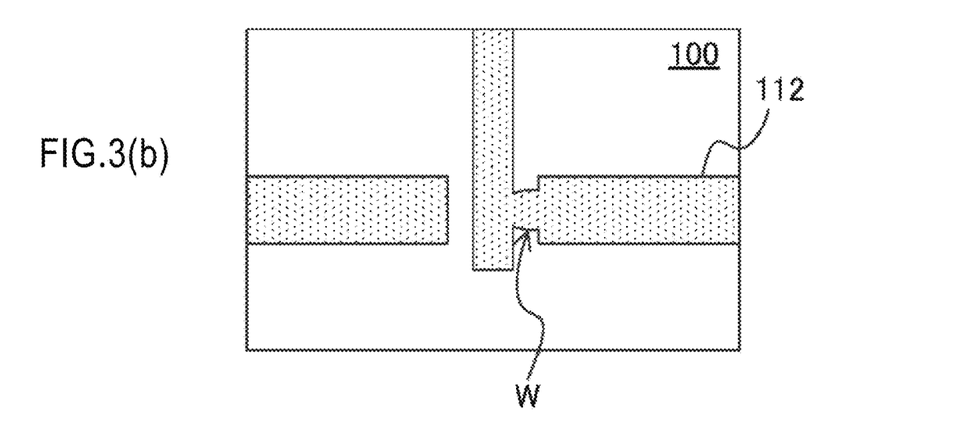

In the color information recognition process (S2), the color information of the defect portion W and its underlayer are recognized by the spectral image acquired by the spectral image acquiring part 6. The control part 5 image analyzes the data of the spectral image transmitted from the spectral image acquiring part 6, and judges the color image of each layer. Herein, it is understood from the information acquired in the inspection process that the defect portion W is present at the second layer 112 of the metal electrode. For this reason, the control part 5 judges the color image of the second layer 112 as the color image of the defect portion W from the transmitted spectral image. FIG. 3(b) shows the judged color image of the second layer 112. The control part 5 calculates the color information (e.g., the RGB value) of the second layer 112 from the color image, and recognizes this value as the color information of the defect portion W. The color information calculated from the color image of the metal electrode has, for example, a RGB value of R: 127, G: 127, and B: 127.

Figure 3C:
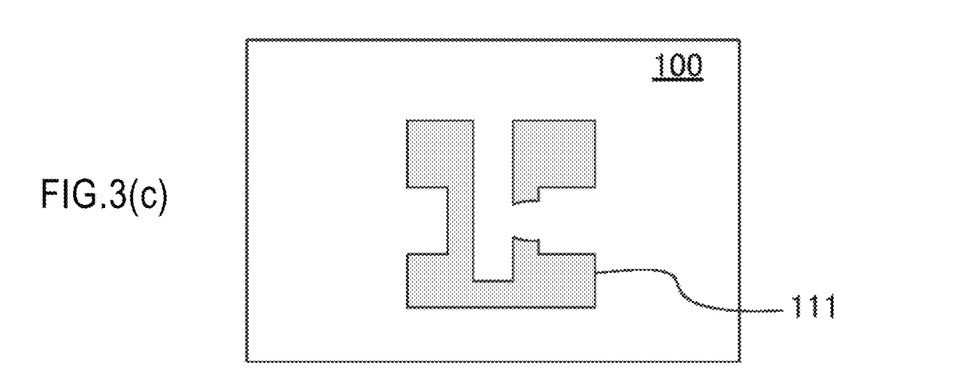

Further, the control part 5 judges the color image of the first layer 111 of the underlayer of the defect portion W by the acquired spectral image as with the second layer 112. FIG. 3(c) shows the color image of the first layer 111 serving as the underlayer of the defect portion W. The control part 5 calculates the color information (e.g., the RGB value) of the first layer 111 from the color image. The color information calculated from the color image of the polysilicon layer has, for example, a RGB value of R: 255, G: 192, and B: 0.

Figures 4A, 4B, 4C:
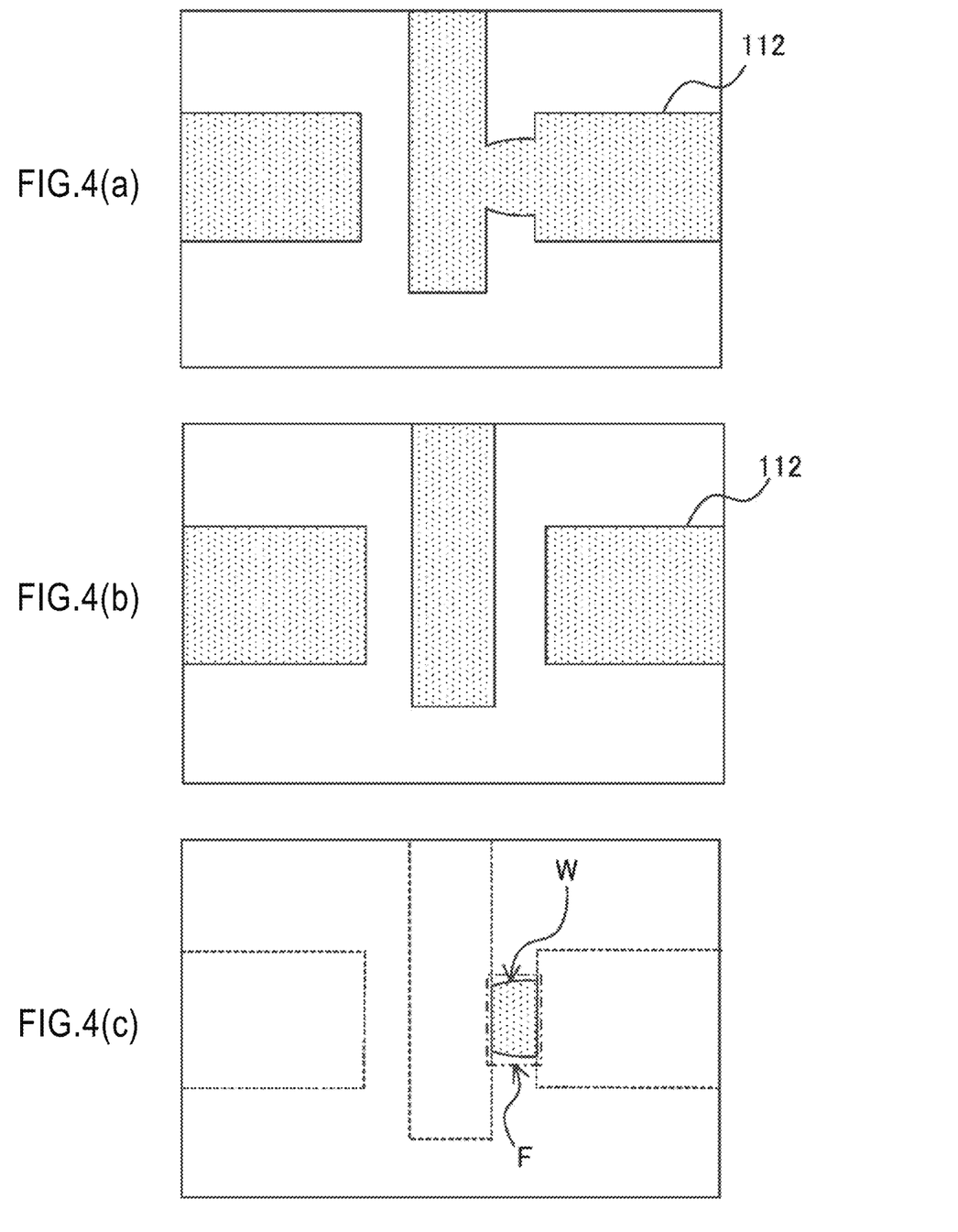

The defect portion image extraction process (S3) compares the color image of the layer (the second layer 112) including the defect portion W with a reference image without a defect, and extracts the image of the defect portion W. FIG. 4(a) is the color image of the second layer 112 judged from the spectral image acquired by the spectral image acquiring part 6. Comparison between the image of this layer and the reference image of the second layer 112 shown in FIG. 4(b) extracts the image of only the defect portion W as shown in FIG. 4(c). The reference image herein is previously inputted in the control part 5 as the design value of the multilayer film structure 110. In the next scan range setting process (S4), using the image of the defect portion W extracted in the defect portion image extraction process (S3), a scan range F of the laser beam is set on the image so as to include the defect portion W.

In the scanning work execution process (S5), at the scanning position at which the color information of the image acquired at the camera part 4 is recognized as that of a defect portion at the time of scan of the inside of the set scan range F with the laser beam, the output of the laser beam is controlled to be ON or High, and at the scanning position at which the color information of the image acquired at the camera part 4 is recognized as that of the underlayer, the output of the laser beam is controlled to be OFF or Low.

Before driving the scanning part 3, and performing scan work of the inside of the scan range F, the control part 5 image analyzes the spectral image previously acquired in the color information recognition process, and recognizes whether the color information of the image in the scan range F corresponds to the color of the defect portion W or corresponds to the color of the underlayer at every scanning position. Specifically, in the region with a RGB value of R: 127, G: 127, and B: 127, the image is the image of the second layer 112 of the metal electrode, and hence the image is recognized as that of the defect portion W in the scan range F. In the range with a RGB value of R: 255, G: 192, and B: 0, the image is the image of the first layer 111 of a polysilicon layer, and hence the image is recognized as that of the underlayer in the scan range F.

Figure 5A:
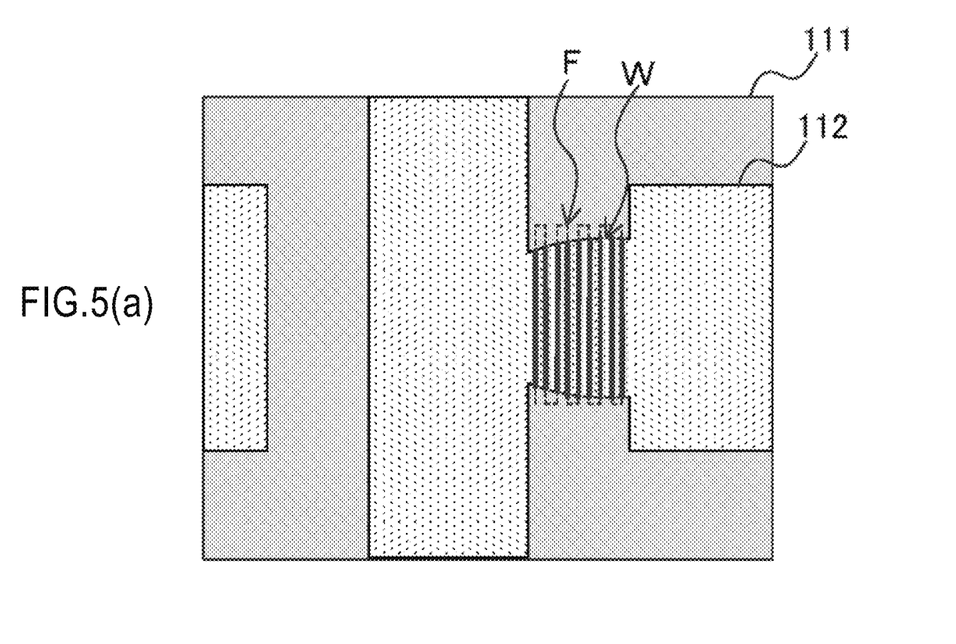
FIG. 5(a) is an explanatory view showing a scanning work execution process and is a first scan work state.

The control part 5 controls the output of the laser beam after start of scan while performing image acquisition by the camera part 4 under the recognition. Then, at the scanning position at which the color information of the image in the scan range corresponds to that of the defect portion W, the output of the laser beam is set On or High, and at the scanning position at which the color information of the image in the scan range corresponds to that of the underlayer, the output of the laser beam is controlled to be OFF or Low. As a result of this, for the output state of the laser beam in the scan range F, as shown in FIG. 5(a), only when the scanning position is on the defect portion W (the second layer 112), the output of the laser beam becomes ON or High; and when the scanning position is on the underlayer (the first layer 111), the output of the laser beam becomes OFF or Low (the bold line shown indicates the site at which the laser beam is On or High).

Figure 5B:
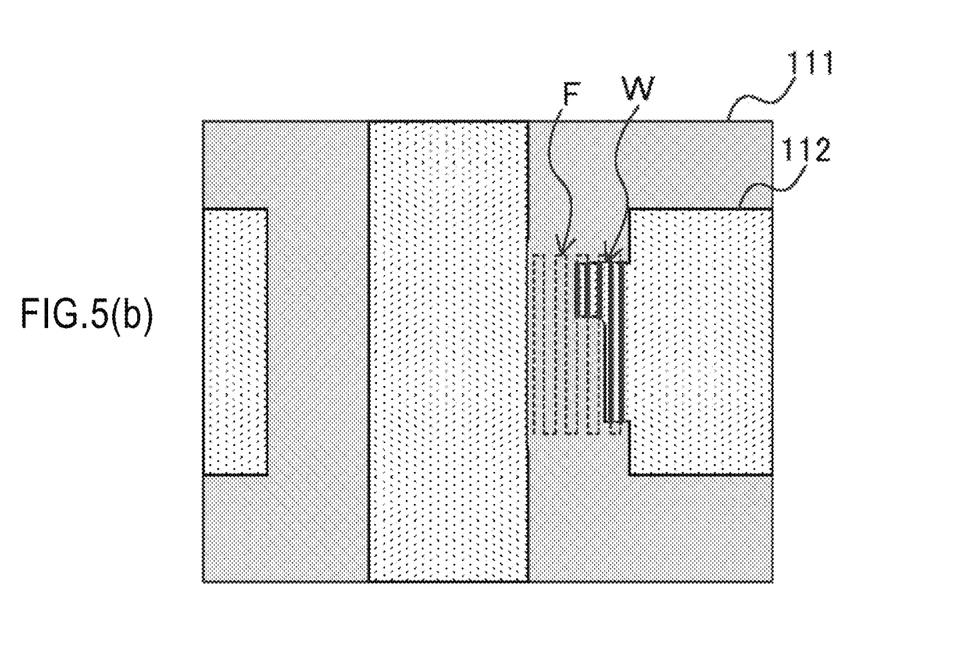
FIG. 5(b) is an explanatory view showing a scanning work execution process and is a second or subsequent scan work state).

The scan of the laser beam is performed by scanning the scan range a plurality of times, and is controlled in the same manner as described previously also for the second and subsequent scan works. As a result of this, even if the underlayer is exposed at a part of the inside of the scan range F, and the defect portion W is partially left upon the second or subsequent scan work, as shown in the FIG. 5(b), at the scanning position at which the information is recognized as that of the underlayer in the scan range F, the output of the laser beam becomes OFF or Low, and only at the scanning position at which the information is recognized as that of the defect portion W in the scan range F, the output of the laser beam is controlled to be ON or High. Then, when the color information of the entire scan range is recognized as corresponding to that of the underlayer before scan, the scan work is completed.

In accordance with such a laser repair device 1 and a laser repair method thereby, only the defect portion can be selectively irradiated with a laser beam by image recognition. For this reason, it is possible to minimize the work on the underlayer and to remove the defect portion W without leaving the uncut portion. As a result of this, the defect portion W can be properly subjected to a correcting process without being affected by the variations in the material of the underlayer and the film thickness of the layer. Further, the exposed layer around the defect portion W can be suppressed from being worked. For this reason, it is possible to properly keep the multilayer film structure even after work.

Incidentally, in the foregoing embodiments, the color information of the defect portion W or the underlayer thereof is recognized by the spectral image resulting from the spectral image acquiring part 6. However, when the color information of the defect portion W or the underlayer thereof can be recognized by image analysis of the color image of the camera part 4, the acquisition of the spectral image by the spectral image acquiring part 6 can be omitted.

Up to this point, the embodiments of the present invention were described in details by reference to the accompanying drawings. However, the specific configuration is not limited to the embodiments, and even changes and the like of the design not departing from the gist of the present invention are included in the present invention. Further, the respective embodiments can be combined by applying the mutual technologies unless the objects, configurations, and the like particularly have contradiction or a problem.

REFERENCE SIGN LIST

1: Laser repair device
2: Laser oscillator
3: Scanning part
3A, 3B: Galvanometer mirror
4: Camera part
5: Control part
6: Spectral image acquiring part
6A: Spectroscope
6B: 2D camera
7: White light source
8: Microscope
8A: Optical system
9: Monitor device
10, 12: Mirror
11 (11A, 11B) Half mirror
13: Switch mirror
20: Filter
100: Substrate
110: Multilayer film structure
111: First layer (polysilicon layer)
112: Second layer (metal electrode)
113: Third layer (insulation layer)
114: Fourth layer (protection layer)
S: Stage
P: Optical axis
L: Laser beam
W: Defect portion
F: Scan range

What is claimed is:

1. A laser repair method for irradiating a defect portion in a multilayer film structure formed on a substrate with a laser beam, and performing a correcting process, the laser repair method comprising:
   acquiring a spectral image of a region including the defect portion in the multilayer film structure; and
   setting a scan range of the laser beam on the spectral image so as to include the defect portion in the multilayer film structure; wherein
   at a time of scan of an inside of the scan range with the laser beam, at a scanning position at which color information of the spectral image is recognized as a position of the defect portion in the multilayer film structure, an output of the laser beam is controlled to be ON or High.

2. The laser repair method according to claim 1, wherein the scan with the laser beam is performed by scanning the scan range a plurality of times.

3. The laser repair method according to claim 2, wherein a region including the defect portion in the multilayer film structure is irradiated with a white light, and a reflected light from the region is spectrally dispersed, thereby acquiring the spectral image.

4. The laser repair method according to claim 3, wherein color information of an underlayer of the defect portion in the multilayer film structure is recognized by the spectral image, and
   at the time of scan of the inside of the scan range with the laser beam, at a scanning position at which color information of the spectral image is recognized as that of the underlayer, an output of the laser beam is controlled to be OFF or Low.

5. The laser repair method according to claim 1, wherein a region including the defect portion in the multilayer film structure is irradiated with a white light, and a reflected light from the region is spectrally dispersed, thereby acquiring the spectral image.

6. The laser repair method according to claim 5, wherein color information of an underlayer of the defect portion in the multilayer film structure is recognized by the spectral image, and
   at the time of scan of the inside of the scan range with the laser beam, at a scanning position at which color information of the spectral image is recognized as that of the underlayer, an output of the laser beam is controlled to be OFF or Low.

7. A laser repair device for irradiating a defect portion in a multilayer film structure formed on a substrate with a laser beam, and performing a correcting process, the laser repair device comprising:
   galvanometer mirrors that scan a scan range including the defect portion in the multilayer film structure with a laser beam;
   spectral image acquiring part that acquires a spectral image of a region including the defect portion in the multilayer film structure; and
   a control part that controls the galvanometer mirrors and an output of the laser beam based on the spectral image acquired by the spectral image acquiring part, wherein
   the control part controls an output of the laser beam to be ON or High at a scanning position at which color information of the spectral image is recognized as a position of the defect portion in the multilayer film structure at a time of scan with the laser beam.

8. The laser repair device according to claim 7, wherein
the spectral image acquiring part acquires the spectral image obtained by irradiating a region including the defect portion in the multilayer film structure with a white light, and spectrally dispersing a reflected light from the region, and the control part recognizes color information of the defect portion in the multilayer film structure by the spectral image.

9. The laser repair device according to claim 8, wherein the control part recognizes color information of an underlayer of the defect portion in the multilayer film structure by the spectral image, and controls an output of the laser beam to be OFF or Low at a scanning position at which color information of the spectral image is recognized as that of the underlayer at the time of scan of an inside of the scan range with the laser beam.

* * * * *